United States Patent [19]
Raad

[11] Patent Number: 5,973,975
[45] Date of Patent: Oct. 26, 1999

[54] METHOD AND CIRCUIT FOR SHARING SENSE AMPLIFIER DRIVERS

[75] Inventor: George B. Raad, Boise, Id.

[73] Assignee: Micron Technology, Inc., Boise, Id.

[21] Appl. No.: 09/124,927

[22] Filed: Jul. 29, 1998

[51] Int. Cl.$^6$ ..................................................... G11C 7/00
[52] U.S. Cl. ........................................... 365/207; 365/203
[58] Field of Search .............................. 365/207, 230.03, 365/190, 205, 189.11, 230.06

[56] References Cited

U.S. PATENT DOCUMENTS

| | | |
|---|---|---|
| 5,334,890 | 8/1994 | Hardee ...................................... 365/207 |
| 5,822,262 | 10/1998 | Hashimoto et al. ..................... 365/207 |

Primary Examiner—Tan T. Nguyen
Attorney, Agent, or Firm—Seed and Berry LLP

[57] ABSTRACT

A sense amplifier driver activates a plurality of sense amplifiers coupled to respective digit lines in each of a plurality of memory-cell arrays. The sense amplifiers each have first and second activation nodes. The sense amplifier driver includes a plurality of drive circuits each coupled to the first and second activation nodes of the sense amplifiers in at least one of the memory-cell arrays. The first activation nodes of the sense amplifiers in at least one of the memory-cell arrays are coupled to a plurality of drive circuits so that the plurality of drive circuits drive the first activation nodes of the sense amplifiers in at least one of the memory-cell arrays in parallel.

31 Claims, 4 Drawing Sheets

5,973,975

METHOD AND CIRCUIT FOR SHARING SENSE AMPLIFIER DRIVERS

TECHNICAL FIELD

The present invention relates generally to semiconductor memories, and more specifically to a sense amplifier drive circuit and method enabling fast and reliable operation of sense amplifier circuits in semiconductor memories powered by low supply voltages.

BACKGROUND OF THE INVENTION

In modern semiconductor memories, the desire to lower power consumption has resulted in a decrease in the magnitude of a supply voltage $V_{CC}$ which provides power to the memories. All electronic systems typically benefit from lower power consumption, particularly portable systems which are battery powered. When the supply voltage $V_{CC}$ decreases, reference voltage circuitry in the memory that develops reference voltages having a values which are a function of the supply voltage accordingly develop reference voltages having different values. For example, in many semiconductor memories digit lines are biased and equilibrated to a voltage equal to the supply voltage $V_{CC}$ divided by two. In this situation, a change in the supply voltage from 5 volts to 3.3 volts results in the bias voltage changing from 2.5 volts to 1.65 volts. Such a decrease in the bias voltage may affect the operation of circuitry in the memory that utilizes the bias voltage during operation.

One type of circuit that may be affected by a decrease in the bias voltage is a sense amplifier circuit. In a typical dynamic random access memory ("DRAM"), a sense amplifier circuit senses data stored in a memory cell by sensing a voltage differential between a pair of complementary digit lines associated with the memory cell as known in the art. The sense amplifier circuit senses the voltage differential and drives the digit line at the higher voltage to approximately the supply voltage $V_{CC}$ and the digit line at the lower voltage to approximately zero volts. Typically, the sense amplifier circuit includes NMOS and PMOS transistors coupled between the digit lines. When the supply voltage $V_{CC}$ decreases, the threshold voltages $V_T$ of these transistors may prevent the sense amplifier circuit from driving the digit lines to the desired voltages as will be explained in more detail below.

FIG. 1 is a schematic of a conventional sense amplifier 10 which senses the data stored in a memory cell 12 coupled to one of a pair of complementary digit lines DL and $\overline{DL}$. A sense amplifier drive circuit 14 activates the sense amplifier 10 in response to a pair of activation signals NLAT and $\overline{PSENSE}$, and a bias and equilibration circuit 16 biases and equilibrates the voltages on the digit lines DL and $\overline{DL}$ to a bias voltage $V_{CC}/2$ in response to an equilibration signal EQ. The memory cell 12 is a conventional DRAM memory cell including an access transistor 18 receiving a word line signal WL and operable, when activated, to couple one plate of a storage capacitor 20 to the digit line DL. Data is stored in the memory cell 12 in the form of a charge on the storage capacitor 120, which receives a cell plate voltage $V_{CC}/2$ on its other plate. Typically, the memory cell 12 stores a binary 1 as a charge on the storage capacitor 20 causing the voltage on the plate coupled to the access transistor 18 to equal $V_{CC}$, and a binary 0 as a charge causing the same voltage to equal zero volts.

The sense amplifier 10 is a conventional sense amplifier including a pair of NMOS transistors 22 and 24 and a pair of PMOS transistors 26 and 28 coupled between a pair of data terminals 27 and 29. A pair of isolation transistors 31 and 33 couple the data terminals 27 and 29 to the complementary digit lines DL and $\overline{DL}$, respectively, in response to an isolation signal ISO. The interconnected sources of the transistors 22 and 24 form an activation node 30, and the interconnected sources of the transistors 26 and 28 form an activation node 32. An NMOS drive transistor 34 in the drive circuit 14 couples the activation node 30 to ground in response to the signal NLAT received on it gate, and a PMOS drive transistor 36 couples the activation node 32 to the supply voltage $V_{CC}$ in response to the signal $\overline{PSENSE}$ received on its gate. The bias and equilibration circuit 16 includes an NMOS equilibration transistor 38 that equalizes the voltages on the digit lines DL and $\overline{DL}$ and two NMOS bias transistors 40 and 42 that drive the voltages on the digit lines DL and $\overline{DL}$, respectively, to the bias voltage $V_{CC}/2$, all of these transistors being activated by the equilibration signal EQ received on their gates.

In operation, before data is read from the memory cell 12, a control circuit (not shown in FIG. 1) drives the signal EQ active, and drives the signals WL, ISO, NLAT, and $\overline{PSENSE}$ inactive. In the following description, the signal ISO remains inactive so the digit lines DL, $\overline{DL}$ remain coupled to the data terminals 27, 29, but one skilled in the art will realize the signal ISO may be used to selectively activate the transistors 31, 33 to enable sharing of the sense amplifier 10 by digit lines in adjacent memory-cell arrays (not shown in FIG. 1). In response to the active signal EQ, the bias and equilibration circuit 16 biases the voltages on the digit lines DL and $\overline{DL}$ to the bias voltage $V_{CC}/2$. For the purposes of the following description, assume the memory cell 12 stores a binary 1 so the voltage on the plate of the storage capacitor 20 coupled to the access transistor 18 is at approximately $V_{CC}$. After the voltages on the digit lines DL and $\overline{DL}$ have been biased at $V_{CC}/2$, the control circuit deactivates the equilibration signal EQ. The control circuit thereafter activates the word line signal WL and charge flows from the storage capacitor 20 through the activated access transistor 18 and onto the digit line DL. In response to the charge transferred from the storage capacitor 20 to the digit line DL, the voltage on the digit line DL increases slightly above the bias voltage $V_{CC}/2$. At this point, a voltage differential exists between the digit lines DL and $\overline{DL}$ since the voltage on the digit line DL is slightly greater than the bias voltage $V_{CC}/2$ present on the digit line $\overline{DL}$.

After the voltage differential has developed on the digit lines DL and $\overline{DL}$, the control circuit activates the signal NLAT turning ON the drive transistor 34 and thereby coupling the activation node 30 to ground. When the drive transistor 34 couples the voltage on the activation node 30 to approximately ground, the transistors 22 and 24 turn ON. The transistor 24 turns ON harder than the transistor 22 due to the higher voltage on the digit line DL applied to its gate. As the transistor 24 turns ON, the voltage on the digit line $\overline{DL}$ goes to ground as charge flows from the digit line $\overline{DL}$ through the transistor 24 and through the drive transistor 34 to ground. The transistor 22 turns OFF as the voltage on the digit line $\overline{DL}$ applied to its gate goes to ground. In this way, the NMOS transistors 22 and 24 turn OFF and ON, respectively, driving the voltage on the digit line $\overline{DL}$ to ground. The NMOS transistors 22 and 24 are typically activated before the PMOS transistors 26 and 28 because they have lower threshold voltages $V_T$ as will be discussed in more detail below.

The control circuit thereafter activates the signal $\overline{PSENSE}$ turning ON the drive transistor 36 and thereby coupling the activation node 32 to the supply voltage $V_{CC}$. When the drive transistor 36 couples the voltage on the activation node 32 to approximately $V_{CC}$, the transistors 26 and 28 turn ON. The transistor 26 turns ON much harder than the transistor 28 due to the voltage of approximately zero volts on the digit line $\overline{DL}$ applied to its gate. As the transistor 26 turns ON, the voltage on the digit line DL goes to the supply voltage $V_{CC}$ as charge flows from the supply voltage $V_{CC}$ through the drive transistor 36 and through the transistor 26 to the digit line DL. In this way, the transistors 26 and 28 turn ON and OFF, respectively, driving the voltage on the digit line DL to the supply voltage $V_{CC}$. The sense amplifier 10 has at this point driven the voltages on the digit lines DL and $\overline{DL}$ high and low, respectively, corresponding to the binary 1 stored in the memory cell 12.

The schematic of FIG. 1 illustrates the single sense amplifier 10 coupled to the drive circuit 14. In a typical DRAM, however, the drive circuit 14 may be coupled to the nodes 30 and 32 of hundreds or even thousands of sense amplifiers 10 depending on the number of columns of memory cells in a memory-cell array. When thousands of activation nodes 30 are coupled to the single drive transistor 34, current flows from thousands of digit lines $\overline{DL}$ through the associated transistors 24 and then through the drive transistor 34. The activated drive transistor 34 presents a source-to-drain resistance which, although relatively small, may result in significant voltage drop across the transistor 34 due to the current from the thousands of digit lines $\overline{DL}$. The voltage drop across the drive transistor 34 corresponds to the voltage on node 30 and may not exceed a maximum allowable voltage, as will be explained in more detail below.

In the sense amplifier 10, the difference between the voltage on the digit line DL applied to the gate of the transistor 24 and the voltage on the node 30 corresponds to the gate-to-source voltage of the transistor 24. The gate-to-source voltage of the transistor 24 must be greater than the threshold voltage $V_T$ to turn ON the transistor, as known for MOS transistors. As previously explained, when thousands of transistors 24 are activated, the voltage drop on node 30 may rise above ground due to the source-to-drain resistance of the drive transistor 34. If the voltage on the node 30 becomes greater than the voltage on the digit line DL minus the threshold voltage $V_T$, the transistor 24 turns OFF because its gate-to-source voltage is less than the threshold voltage $V_T$. For proper operation of the sense amplifier 10, the transistor 24 must remain active to drive the voltage on the digit line $\overline{DL}$ to ground. The same potential problem exists for the transistor 22, but typically not for the transistors 26 and 28 since the activated one of these transistors has approximately zero volts applied to its gate as a result of one of the transistors 22 and 24 being activated first. The zero volts on the gate of the activated one of the transistors 26 and 28 typically ensures a gate-to-source voltage greater than $V_T$ even for relatively large voltage drops across the drive transistor 36.

The maximum voltage that can develop on the node 30 without turning OFF the transistor 24 is a function of the magnitude of the bias voltage $V_{CC}/2$, which, in turn, is a function of the magnitude of the supply voltage $V_{CC}$. For example, if the supply voltage $V_{CC}$ equals 5 volts and the threshold voltage $V_T$ equals 0.7 volts, the maximum voltage allowable on the node 30 equals 2.5 volts minus 0.7 volts or 1.8 volts. When the supply voltage $V_{CC}$ is 3.3 volts, the maximum voltage allowable on the node 30 equals 1.65 volts minus 0.7 volts or 0.95 volts. Thus, as the supply voltage $V_{CC}$ decreases the maximum voltage allowable on the node 30 decreases accordingly.

The source-to-drain resistance and resulting voltage drop across the drive transistor 34 becomes more critical at low supply voltages $V_{CC}$ because the maximum voltage allowable on the node 30 decreases as the supply voltage $V_{CC}$ decreases. One way to reduce the voltage drop across the drive transistor 34 is to increase the physical dimensions of the drive transistor and thereby reduce its resistance. This approach is limited, however, by physical space constraints on the semiconductor substrate in which the DRAM is formed. The drive transistors 34 and 36 are typically formed in gap-cell regions on the semiconductor substrate defined between adjacent banks of sense amplifiers at the corners of memory-cell arrays as understood by one skilled in the art. The size of the gap-cell regions limits the maximum physical dimensions of the drive transistors. Moreover, in modern DRAMs the size of the gap-cell regions is decreasing in response to corresponding decreases in the size of other circuitry on the DRAM resulting, in part, from advances in semiconductor process technology.

There is a need for a sense amplifier drive circuit that enables sense amplifier circuits to quickly and reliably sense data stored in addressed memory cells in a semiconductor memory having a reduced supply voltage.

SUMMARY OF THE INVENTION

A sense amplifier driver activates a plurality of sense amplifiers coupled to respective digit lines in each of a plurality of memory-cell arrays. The sense amplifiers each have first and second activation nodes. The sense amplifier driver includes a plurality of drive circuits each coupled to the first and second activation nodes of the sense amplifiers in at least one of the memory-cell arrays. The first activation nodes of the sense amplifiers in at least one of the memory-cell arrays are coupled to a plurality of drive circuits so that the plurality of drive circuits drive the first activation nodes of the sense amplifiers in at least one of the memory-cell arrays in parallel.

In one embodiment, the drive circuits each include a first drive transistor coupled between the first activation node and a first voltage source which receives a first drive signal on its gate, and a second drive transistor coupled between the second activation node and a second voltage source which receives a second drive signal on its gate.

DETAILED DESCRIPTION OF THE INVENTION

Figure 1:
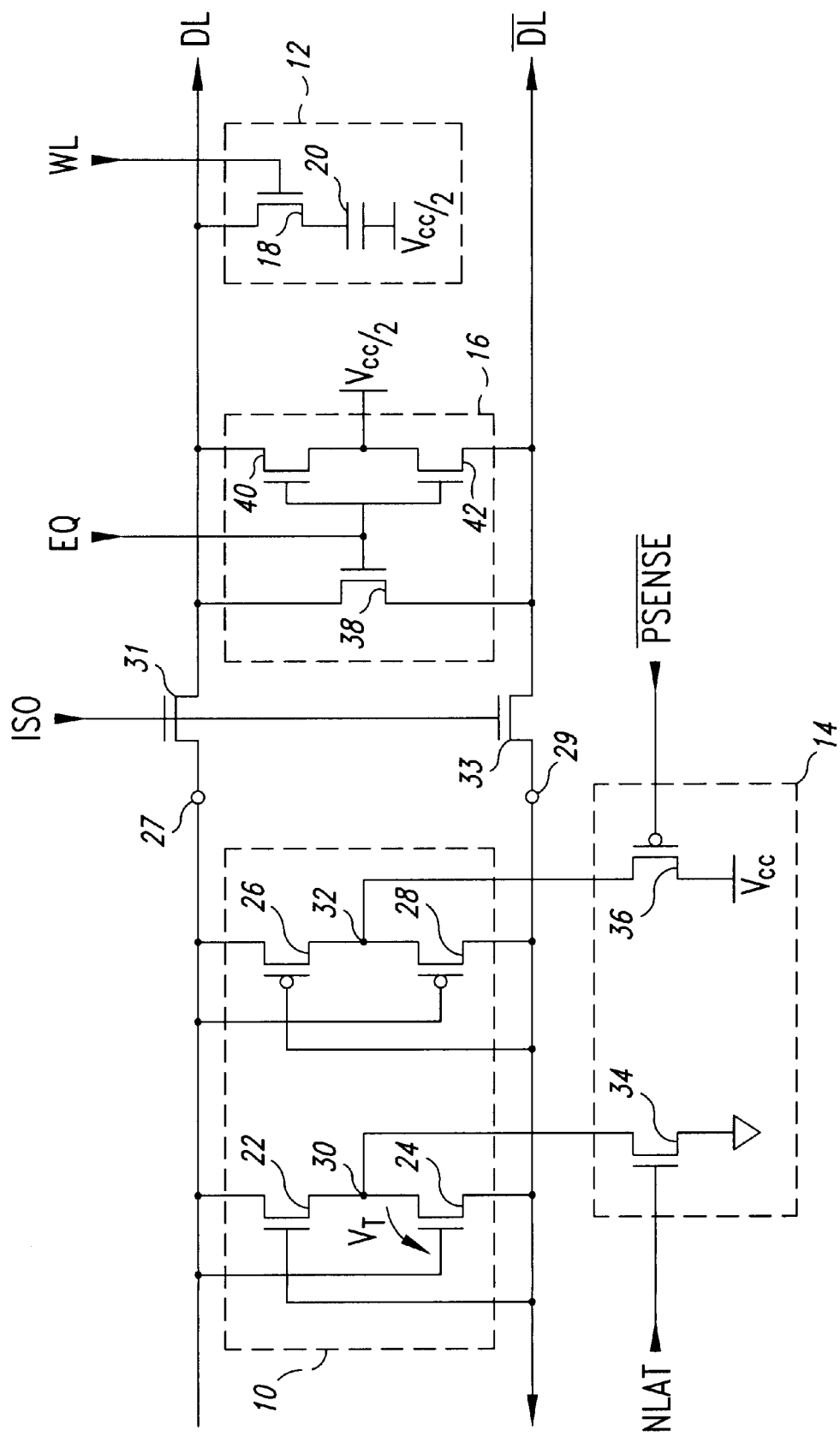
FIG. 1 is schematic of a conventional sense amplifier coupled to a memory cell and a sense amplifier drive circuit.
Figure 2:
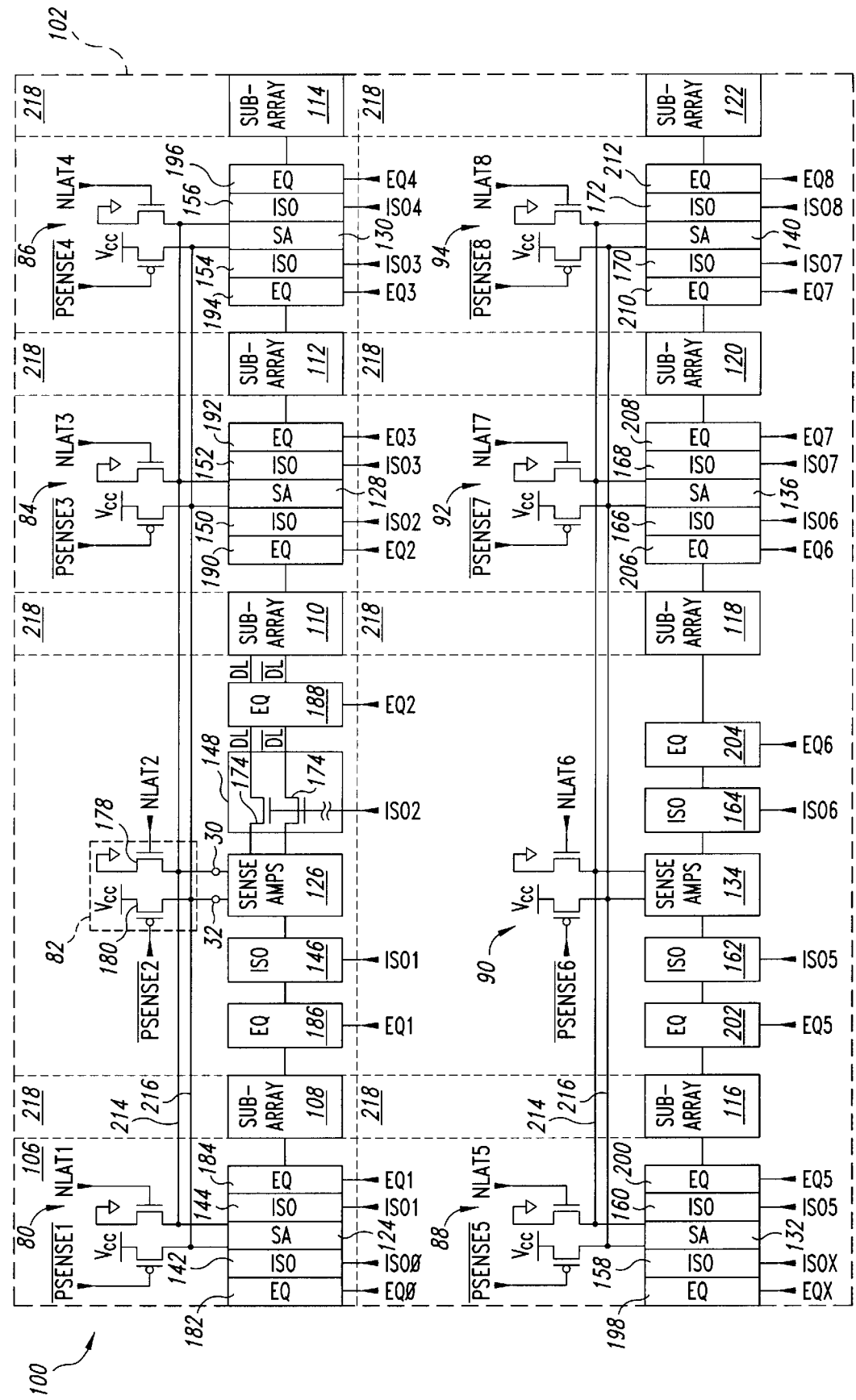
FIG. 2 is a schematic block diagram of a portion of a dynamic random access memory including a number of sense amplifier drive circuits according to one embodiment of the present invention.

FIG. 2 is a schematic block diagram of a DRAM 100 formed in a semiconductor substrate 102 including a number of sense amplifier drive circuits 80–94 according to one embodiment of the present invention. The sense amplifier drive circuits 80–94 are formed in respective gap-cell regions 106 of the substrate 102, and are coupled to associated sense amplifier banks 124–140, respectively. Each bank 124–140 includes a plurality of individual sense amplifiers 10 as previously described with reference to FIG. 1. In the DRAM 100, the sense amplifier drive circuits 80–86 and 88–94 are interconnected, respectively, and the sense amplifier drive circuits within each of these two groups operate in parallel to enable proper operation of the sense amplifier banks 124–140 at low power supply voltages $V_{CC}$ as will be explained in more detail below.

The DRAM 100 includes a number of subarrays 108–122 formed in corresponding array regions arranged in rows and columns on the substrate 102. In the following description, only the subarrays 108–122 will be discussed although the DRAM 100 may include N rows by M columns of subarrays and associated circuitry as will be understood by those skilled in the art. The subarrays 108–122 each include a number of the memory cells 12 (not shown in FIG. 2) as previously described with reference to FIG. 1. The memory cells 12 in each subarray 108–122 are arranged in rows and columns, each memory cell in a row coupled to an associated word line and each memory cell in a column coupled to one of an associated pair of complementary digit lines DL and $\overline{DL}$. The DRAM 100 further includes a number of equilibration circuits 182–212 formed in the substrate 102, two such equilibration circuits being formed between adjacent subarrays 108–122 in each row of subarrays. Each of the equilibration circuits 182–212 is coupled to the digit lines DL and $\overline{DL}$ of the adjacent one of the subarrays 108–122, as shown in more detail for the equilibration circuit 188. The equilibration circuits 182–212 each include a number of the individual circuits 16 as previously described with reference to FIG. 1, each individual circuit 16 being coupled between a pair of digit lines DL and $\overline{DL}$ of the adjacent one of the subarrays 108–122. The equilibration circuits 182–212 each receive one of a plurality of equilibration signals EQ0–EQ8, and operate in response to these signals to bias and equilibrate the voltages on the digit lines DL and $\overline{DL}$ of the associated one of the subarrays 108–122 to $V_{CC}/2$. In the embodiment of FIG. 1, each of the subarrays 108–122 has its digit lines DL and $\overline{DL}$ coupled to two of the equilibration circuits 182–212, one of the equilibration circuits coupled to the digit lines of all even-numbered columns and the other coupled to the digit lines of all odd-numbered columns.

The sense amplifier banks 124–140 are typically formed between adjacent subarrays 108–122 in each row of subarrays. Each of the sense amplifier banks 124–140 includes activation nodes 30–32 to which signals are applied to activate the individual sense amplifiers 10 in the bank as described with reference to FIG. 1. The individual sense amplifiers 10 in each of the sense amplifier banks 124–140 are coupled to corresponding pairs of digit lines DL and $\overline{DL}$ in each of the two adjacent subarrays 108–122 through two associated isolation circuits 142–172. Each of the isolation circuits 142–172 operates in response to one of a plurality of isolation signals ISO0–ISO8 to isolate the associated sense amplifier circuits 124–140 from the digit lines DL and $\overline{DL}$ of the associated subarrays 108–122. The isolation circuits 142–172 each include a plurality of NMOS transistors 174, two of which are shown for the sense amplifier circuit 148.

In the DRAM 100, the sense amplifier drive circuits 80–94 each include an NMOS drive transistor 178 and PMOS drive transistor 180 coupled between ground and the activation nodes 30 and 32, respectively, of the adjacent one of the sense amplifier banks 124–140. Each of the NMOS drive transistors 178 receives one of a plurality of activation signals NLAT1–NLAT8 and presents a relatively low resistance between the associated mode 30 and ground responsive to the received signal. The PMOS drive transistors 180 each receive one of a plurality of activation signals PSENSE1–PNSENSE8 and present a relatively low resistance between the supply voltage $V_{CC}$ and the associated node 32 in response to the received signal. In addition, the drains of all drive transistors 178 in the same row of gap-cells 106 are connected through conductive traces 214, and the drains of all drive transistors 180 in the same row of gap-cells 106 are connected through conductive traces 216. For example, in FIG. 2 two rows of gap-cells 106 are depicted, row one above the subarrays 108–114 and row two above the subarrays 116–122. As shown, the drain terminals of the drive transistors 178 in the drive circuits 80–86 are connected by the conductive line 214, and the drive transistors 180 connected by the conductive line 216. The same is true of the drive transistors 178 and 180 in the sense amplifier drive circuits 88–94 formed in the second row of gap-cells 106.

In the embodiment of FIG. 2, the conductive lines 214 and 216 are disposed through regions 218 of the substrate 102 defined between adjacent gap-cell regions 106. The regions 218 typically include row decode circuitry (not shown in FIG. 2) that decodes a row address applied to the DRAM 100. Although the conductive lines 214 and 216 are disposed through the regions 218 in the embodiment of FIG. 1, one skilled in the art will realize that these lines may also be formed in other regions on the semiconductor substrate 102 to provide the required electrical connections. The physical layout of the circuitry on the DRAM 100 will determine the most efficient physical location for the conductive lines 214 and 216.

In operation during a read data transfer operation, an external circuit (not shown in FIG. 1) applies address and control signals to the DRAM 100 as known in the art. Before the start of a read operation, the signals $\overline{PSENSE1}$–$\overline{PSENSE8}$, NLAT1–NLAT8, ISO0–ISO8, and all word lines in the subarrays 108–122 are inactive, and all the equilibration signals EQ0–EQ8 are active. In this way, all the memory cells in the subarrays 108–122, sense amplifier circuits 124–140, and the drive circuits 80–94 are inactive while the equilibration circuits 182–212 are active, biasing the voltages on all the digit lines DL and $\overline{DL}$ to $V_{CC}/2$. In addition, the isolation circuits 142–172 couple the sense amplifier circuits 124–140 to the digit lines DL and $\overline{DL}$ of the associated subarrays 108–122 in response to the inactive isolation signals ISO0–ISO8.

At the start of a read data transfer operation, a row address is latched into the DRAM 100 and a portion of that row address decoded to determine which of the subarrays 108–122 contains the addressed memory cell. In response to the decoded portion of the row address, control circuitry (not shown in FIG. 2) activates selected ones of the isolation signals ISO1–ISO8 to isolate the subarrays 108–122 not containing the addressed memory-cell. For the purposes of the following description, assume the subarray 110 contains the addressed memory-cell and is designated the "active" subarray, while all other subarrays are designated "inactive." In this situation, the control circuitry activates the isolation signals ISO0, ISO1, and ISO3–ISO8 while maintaining the isolation signal IS)2 inactive. At this point, the subarrays 108 and 112–122 are isolated from their associated sense amplifier banks 124–140, and the subarray 110 is coupled to the sense amplifier banks 126 and 128 through the deactivated isolation circuits 148 and 150, respectively.

The control circuitry thereafter deactivates the equilibration signal EQ2 applied to the equilibration circuits 188 and 190 while maintaining the equilibration signals EQ0, EQ1 and EQ3–EQ8 active to bias the voltages on the digit lines DL and $\overline{DL}$ in the inactive subarrays 108 and 112–122 at $V_{CC}/2$. In this way, the data retention time of the memory-cells in the inactive subarrays 108 and 112–122 is maximized as understood by one skilled in the art. Next, the row address decode circuitry activates the word line of the row of memory-cells in the subarray 110 containing the addressed memory-cell. After this word line has been activated, the control circuitry activates the signals NLAT1–NLAT4 turning ON the drive transistors 178 in each of the sense amplifier drive circuits 80–86. When the four drive transistors 178 in the circuits 80–86 are activated, the sense amplifier banks 126 and 128 drive the appropriate digit lines DL and $\overline{DL}$ in the subarray 110 to ground. The control circuit then activates the signals $\overline{PSENSE1}$–$\overline{PSENSE4}$ turning ON the drive transistors 180 in the drive circuits 80–86 such that the sense amplifier banks 126 and 128 drive the appropriate digit lines DL and $\overline{DL}$ in the subarray 110 to the supply voltage $V_{CC}$. At this point, the data of each memory cell in the activated row in the subarray 110 is stored in the sense amplifier banks 126 and 128. The data stored in the individual sense amplifier 10 corresponding to a decoded column address is thereafter transferred onto a data bus (not shown in FIG. 2) of the DRAM 100 where it may be read by the external circuit.

The structure of the drive circuits 80–94 in the DRAM 100 enables the drive circuits 80 and 86 associated with the inactive subarrays 108 and 112 to be utilized in activating the sense amplifier banks 126 and 128. When the signals NLAT1–NLAT4 are activated, the four drive transistors 178 operate in parallel presenting an equivalent resistance between ground and the activation nodes 30 of the sense amplifier circuits 126 and 128 that equals one fourth the resistance presented by a single drive transistor 178. This equivalent resistance presented by the four activated drive transistors 178 is sufficiently small to ensure the gate-to-source voltages of the NMOS transistors in the sense amplifier banks 126 and 128 exceed their associated threshold voltages $V_T$ even at low power supply voltages $V_{CC}$. The four PMOS transistors 180 operate in parallel in the same way to present an equivalent resistance that reduces the voltage drop across such transistors and ensure the gate-to-source voltages of the PMOS transistors in the sense amplifier banks 126 and 128 exceed their associated threshold voltages $V_T$.

In the DRAM 100, the structure of the drive circuits 80–94 provides more flexibility in sizing the drive transistors 178 and 180. In conventional DRAMs, as the supply voltage $V_{CC}$ decreases, the size of the drive transistors 178 and 180 must increase to reduce their resistances. The structure of the drive circuits 80–94, however, alleviates the need to increase the size of the individual drive transistors 178 and 180 by operating such transistors in parallel. This is important because as the size of circuitry on modern DRAMs decreases, the size of the gap-cell regions 106 decreases accordingly thereby reducing the space available for forming the drive transistors 178 and 180.

In addition to providing proper operation at low power supply voltages $V_{CC}$, parallel operation of the drive transistors 178 and 180 enables the sense amplifier banks 126 and 128 to more quickly drive the digit lines to the required voltage levels. This is easily understood with reference to FIG. 1 in which the drive transistors 180 operating in parallel would replace the drive transistor 36. In this situation, when the transistor 26 is activated, for example, the four drive transistors 180 operating in parallel enable four times the current to flow through the transistor 26 to more quickly charge the capacitance of the digit line DL. Alternatively, the equivalent resistance presented by the four transistors 180 may be viewed as reducing the resistance of the RC network formed by the series connection of the equivalent resistance, the resistance presented by the transistor 26, and the capacitance of the digit line DL. The same holds true for operation of the transistors 22 and 24 when the drive transistor 34 is replaced by the four drive transistors 178 operating in parallel.

It should be noted that when the drive circuits 80–86 are activated, the sense amplifier banks 124–130 are all activated. As a result, the individual sense amplifiers 10 in the sense amplifier banks 124 and 130, which are associated with the inactive subarrays, may be activated and drive the voltages on their data terminals to ground and the supply voltage $V_{CC}$. If this occurs, the overall current consumption of DRAM 100 will increase slightly since current is required to drive the data terminal voltages to such levels. This does not affect proper operation of the DRAM 100, however, because the sense amplifier banks 124 and 130 are isolated from the adjacent subarrays by the isolation circuits 142, 144, 154, and 156. Such isolation is necessary to prevent the sense amplifiers banks 124 and 130 from latching the voltages on the digit lines DL and $\overline{DL}$ of the inactive subarrays 108, 112, and 114 and thereby reducing the data retention time of the memory cells in the inactive subarrays.

In another embodiment of the present invention, the DRAM 100 is formed as shown in FIG. 2 but without the conductive line 216. As previously discussed, the problem of insufficient gate-to-source voltages is not as great for the PMOS transistors in the sense amplifier banks 124–140 so the conductive line 216 may be eliminated and the individual PMOS drive transistors 180 activated independently. In yet another embodiment, the signals NLAT1–NLAT8 and $\overline{PSENSE1}$–$\overline{PSENSE8}$ are selectively activated such that only the drive circuits associated with the activated one of the subarray 108–122 and the adjacent drive circuits are activated. For example, in FIG. 2 assume the subarray 116 is active. In this embodiment, the signals NLAT5–NLAT7 and $\overline{PSENSE5}$–$\overline{PSENSE7}$ are activated, along with signals NLAT and $\overline{PSENSE}$ received by a drive circuit adjacent the drive circuit 88 to the left (not shown in FIG. 2). The signals NLAT8 and $\overline{PSENSE8}$ are not activated in this embodiment, which may reduce overall current consumption of the DRAM 100. In a further embodiment, a predetermined number of the drive circuits 80–94 in each row of drive circuits are activated. For example, assume in FIG. 1 there are ten drive circuits and subarrays in the first row including the subarrays 108–114. When the subarray 108 is active, for example, a predetermined number of the ten drive circuits are activated to drive the sense amplifier banks 124 and 126.

Figure 5:
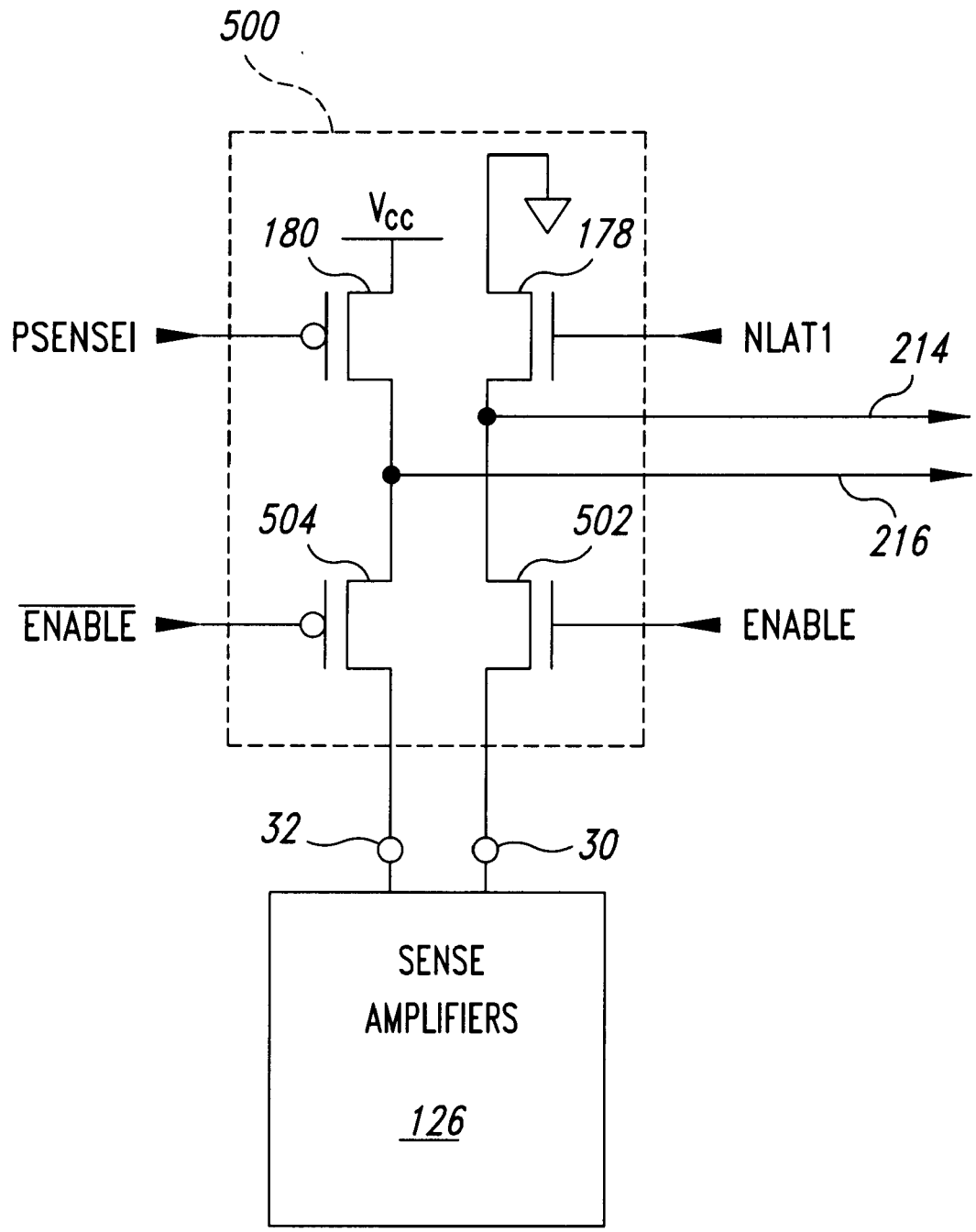
FIG. 5 is a schematic block diagram of a sense amplifier drive circuit according to one embodiment of the present invention.

FIG. 5 is a schematic block diagram of a sense amplifier drive circuit 500 according to another embodiment of the present invention. The drive circuit 500 may be utilized in place of the drive circuits 80–94 in FIG. 2. Components of the drive circuit 500 that are the same as those previously described with reference to FIG. 2 have been given the same reference numbers, and will not, for the sake of brevity, be described in more detail. The drive circuit 500 is the same as the previously described drive circuits 80–94 except for the inclusion of a pair of enable transistors 502, 504 coupled between activation nodes 30, 32 and drive transistors 178, 180. The enable transistors 502 and 504 receive on their respective gates enable signals ENABLE and $\overline{ENABLE}$. When the enable signals ENABLE, $\overline{ENABLE}$ are active, the transistors 502 and 504 turn ON, coupling the activation nodes 30 and 32 to the drive transistors 178 and 180, respectively. If the enable signals ENABLE, $\overline{\text{ENABLE}}$ are inactive, the transistors 502, 504 isolate the activation nodes 30, 32 from the drive transistors 178, 180. As previously described, the conductive lines 214, 216 enable drive transistors 178, 180 in multiple drive circuits (not shown in FIG. 5) to operate in parallel to drive the voltages on the activation nodes 30, 32 to their desired values.

In operation, when the signals ENABLE, $\overline{\text{ENABLE}}$ are active, the drive circuit 500 operates identically to each of the drive circuits 80–94 previously described with reference to FIG. 2. When the signals ENABLE, $\overline{\text{ENABLE}}$ are inactive, however, the drive circuit 500 is isolated from the activation nodes 30, 32 of all sense amplifiers. Thus, by activating the signals ENABLE, $\overline{\text{ENABLE}}$ only for the drive circuits 500 associated with the active subarray, the drive circuits 500 are isolated from all sense amplifiers except those associated with the active subarray. In this way, the sense amplifiers associated with inactive subarrays do not latch the digit lines of those inactive subarrays, which can reduce the data retention time of memory cells in the inactive subarrays as previously described. As described with reference to FIG. 2, the isolation transistors 174 may also be used to isolate sense amplifiers associated with inactive subarrays. Utilizing the enable transistors 502, 504, however, provides more flexibility in designing the control circuitry in a memory device including the drive circuits 500. For example, if existing control circuitry activates the isolation transistors 174 associated with inactive subarrays, such control circuitry need not be modified and new control circuitry added merely to control the enable transistors 502, 504.

Figure 3:
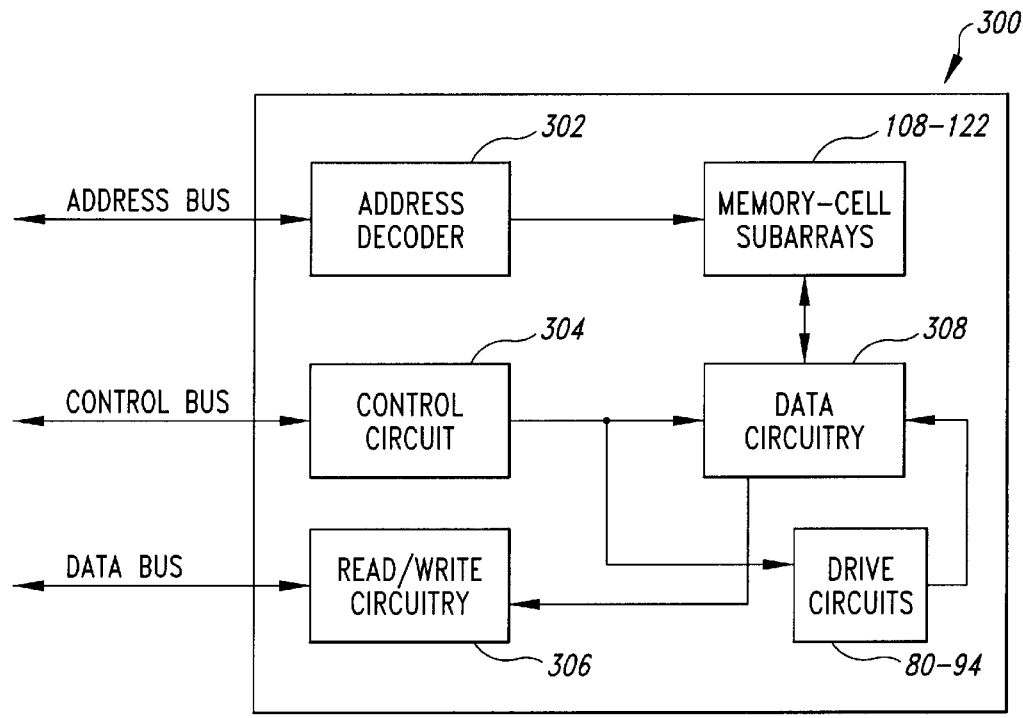
FIG. 3 is a block diagram of a memory device including the sense amplifier drive circuits of FIG. 2.

FIG. 3 is a functional block diagram of a memory device 300 including the memory-cell subarrays 108–122 and sense amplifier drive circuits 80–94 of FIG. 2. The memory device 300 further includes an address decoder 302 receiving address signals on an address bus and providing decoded address signals to the subarrays 108–122. A control circuit 304 receives controls signals on a control bus and controls the operation of the other components in the memory device 300 including the sense amplifier drive circuits 80–94 and a data circuit 308 containing sense amplifier circuits, equilibration circuits, and isolation circuits as previously described. A read/write circuit 306 is coupled to a data bus and operates to transfer information to and from the data bus during read and write operations, respectively. All of the address decoder 302, control circuit 304, and read/write circuit 306 are conventional and known in the art.

In operation, external circuitry provides address, control, and data signals on the respective busses to the memory device 300. During a read cycle, the external circuitry provides a memory address on the address bus and control signals on the control bus to the memory device 300. In response to the memory address on the address bus, the address decoder 302 provides a decoded memory address to the corresponding one of the subarrays 108–122, and the control circuit 304 provides control signals to the circuitry 308 and drive circuits 80–94 in response to the control signals on the control bus. The control signals from the control circuit 304 control the data circuitry 308 and drive circuits 80–94 such that data in the subarray 108–122 corresponding to the decoded memory address is provided to the read/write circuitry 306. The read/write circuitry 306 then provides this data on the data bus for use by the external circuitry. During a write cycle, the external circuitry applies a memory address on the address bus, control signals on the control bus, and data on the data bus. Once again, the address decoder 302 decodes the memory address on the address bus and provides a decoded address the corresponding one of the subarrays 108–122. The read/write circuitry 306 transfers the data applied on the data bus through the data circuit 308 and to the addressed subarray 108–122, and this data is stored in the addressed memory cells under control of the control signals from the control circuit 304.

Figure 4:
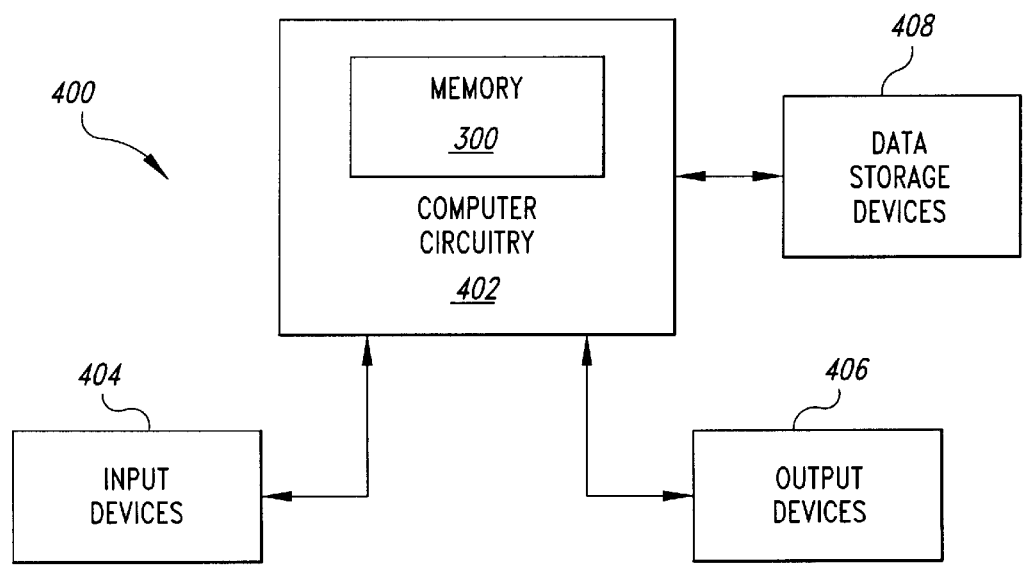
FIG. 4 is a computer system including the memory device of FIG. 3.

FIG. 4 is a block diagram of a computer system 400 including the memory device 300 of FIG. 3. The computer system 400 includes computer circuitry 402 for performing various computing functions, such as executing specific software to perform specific calculations or tasks. In addition, the computer system 400 includes one or more input devices 404, such as a keyboard or a mouse, coupled to the computer circuitry 402 to allow an operator to interface with the computer system 400. Typically, the computer system 400 also includes one or more output devices 406 coupled to the computer circuitry 402, such output devices typically being a printer or a video terminal. One or more data storage devices 408 are also typically coupled to the computer circuitry 402 to store data or retrieve data from external storage media (not shown). Examples of typical data storage devices 408 include hard and floppy disks, tape cassettes, and compact disk read only memories ("CD-ROMs"). The computer circuitry 402 is typically coupled to the memory device 300 through a control bus, a data bus, and an address bus to provide for writing data to and reading data from the memory device 300.

It is to be understood that even though various embodiments and advantages of the present invention have been set forth in the forgoing description, the above disclosure is illustrative only, and changes may be made in detail, and yet remain within the broad principles of the invention. Therefore, the present invention is to be limited only by the appended claims.

I claim:

1. A sense amplifier driver for activating a plurality of sense amplifiers coupled to respective digit lines in each of a plurality of memory-cell arrays, each of the sense amplifiers having first and second activation nodes, the sense amplifier driver comprising a plurality of drive circuits, each of the drive circuits being coupled to the first and second activation nodes of the sense amplifiers in at least one of the memory-cell arrays, the first activation nodes of the sense amplifiers in at least one of the memory-cell arrays being coupled to a plurality of drive circuits so that the plurality of drive circuits drive the first activation nodes of the sense amplifiers in at least one of the memory-cell arrays in parallel.

2. The circuit of claim 1 wherein a respective sense amplifier drive circuit is provided for each of the plurality of memory-cell arrays.

3. The circuit of claim 1, further including the second activation nodes of the sense amplifiers in at least one of the memory-cell arrays being coupled to a plurality of drive circuits so that the plurality of drive circuits drive the second activation nodes of the sense amplifiers in at least one of the memory-cell arrays in parallel.

4. The circuit of claim 1 wherein the plurality of sense amplifier drive circuits are formed in respective gap-cell regions of a semiconductor substrate.

5. The circuit of claim 1 wherein each of the sense amplifier drive circuits comprises:

an NMOS drive transistor having its source and drain coupled between a first voltage source and the first activation nodes of at least some of the plurality of sense amplifiers, and its gate coupled to receive a first drive signal; and a PMOS drive transistor having its source and drain coupled between a second voltage source and the second activation nodes of at least some of the plurality of sense amplifiers, and its gate coupled to receive a second drive signal.

6. A memory device, comprising:

an address decoder;

a read/write circuit;

a control circuit;

a plurality of memory-cell arrays, each memory-cell array including a plurality of memory cells arranged in rows and columns and coupled to one of a pair of complementary digit lines associated with each column;

a plurality of equilibration circuits, each equilibration circuit coupled between a pair of complementary digit lines operable to equilibrate the voltage on the digit lines to a bias voltage;

a plurality of sense amplifiers, each sense amplifier including complementary data nodes, and first and second activation nodes;

a plurality of isolation circuits, each isolation circuit coupled between the complementary data nodes of a sense amplifier and a respective pair of complementary digit lines and operable to isolate the data nodes from the respective digit lines; and a plurality of drive circuits, each of the drive circuits being coupled to the first and second activation nodes of the sense amplifiers in at least one of the memory-cell arrays, the first activation nodes of the sense amplifiers in at least one of the memory-cell arrays being coupled to a plurality of drive circuits so that the plurality of drive circuits drive the first activation nodes of the sense amplifiers in at least one of the memory-cell arrays in parallel.

7. The circuit of claim 6 wherein each of the sense amplifier drive circuits comprises:

an NMOS drive transistor having its source and drain coupled between a first voltage source and the first activation nodes of at least some of the plurality of sense amplifiers, and its gate coupled to receive a first drive signal; and a PMOS drive transistor having its source and drain coupled between a second voltage source and the second activation nodes of at least some of the plurality of sense amplifiers, and its gate coupled to receive a second drive signal.

8. The memory device of claim 6 wherein each of the sense amplifiers comprises:

a first sense switch having a control terminal coupled to one of the complementary data nodes, a first signal terminal coupled to a common reference voltage source, and a second signal terminal coupled to the other complementary data nodes;

a second sense switch having a control terminal coupled to the other of the complementary data nodes, a first signal terminal coupled to the common reference voltage source, and a second signal terminal coupled to the one of the complementary data nodes;

a third sense switch having a control terminal coupled to the other complementary data nodes, a first signal terminal coupled to a supply voltage source $V_{CC}$, and a second signal terminal coupled to the one of the complementary data nodes; and a fourth sense switch having a control terminal coupled to the one of the complementary data nodes, a first signal terminal coupled to the supply voltage source $V_{CC}$, and a second signal terminal coupled to the other complementary data nodes.

9. The memory device of claim 6 wherein each isolation circuit includes a plurality of transistors, each transistor having signal terminals coupled between one of the digit lines and one of the data nodes of an associated sense amplifier, and a control terminal adapted to receive a respective isolation signal.

10. A memory device, comprising:

an address decoder;

a read/write circuit;

a control circuit;

a plurality of memory-cell arrays formed in rows and columns on a semiconductor substrate, each memory-cell array including a plurality of memory cells arranged in rows and columns and coupled to one of a pair of complementary digit lines associated with each column;

a plurality of sense amplifier banks formed in rows and columns on the semiconductor substrate in regions between adjacent memory-cell arrays in each row of memory-cell arrays, each bank including a plurality of sense amplifiers including complementary data nodes and first and second activation nodes, and each bank being activated in response to respective activation signals on the first and second activation nodes;

a plurality of isolation circuits formed in the regions between adjacent memory-cell arrays, first and second isolation circuits being formed in each region, the first isolation circuit coupled between the complementary data nodes of the adjacent bank of sense amplifiers and the digit lines of one of the adjacent memory-cell arrays and the second isolation circuit coupled between the complementary data nodes of the adjacent bank of sense amplifiers and the digit lines of the other of the adjacent memory-cell array, each of the first and second isolation circuits isolating the data nodes from the digit lines of the associated memory-cell array in response to associated isolation signals; and a plurality of drive circuits formed in respective gap-cell regions on the semiconductor substrate defined between adjacent rows of sense amplifier banks, each drive circuit having first and second output terminals coupled to the first and second activation nodes of the sense amplifiers in one of the adjacent sense amplifier banks, respectively, the first output terminal of each of the drive circuits being coupled to the first output terminal of at least one other drive circuit.

11. The memory device of claim 10 wherein each drive circuit comprises:

an NMOS drive transistor having its source and drain coupled between the first output terminal and a first voltage source, and its gate coupled to receive a respective first drive signal; and a PMOS drive transistor having its source and drain coupled between the second output terminal and a second voltage source, and its gate coupled to receive a respective second drive signal.

12. The memory device of claim 10 wherein the first and second activation nodes of the sense amplifier banks in each row are respectively coupled together through respective conductive lines formed on the semiconductor substrate in row decode regions of the semiconductor substrate defined between adjacent gap-cell regions.

13. A dynamic random access memory, comprising:
an address bus;
a control bus;
a data bus;
an address decoder coupled to the address bus;
a control circuit coupled to the control bus;
a read/write circuit coupled to the data bus;
a plurality of memory-cell arrays, each memory-cell array including a plurality of memory cells arranged in rows and columns and coupled to one of a pair of complementary digit lines associated with each column;
a plurality of sense amplifiers, each sense amplifier coupled to a pair of complementary digit lines and including first and second activation nodes; and
a plurality of drive circuits, each of the drive circuits being coupled to the first and second activation nodes of the sense amplifiers in at least one of the memory-cell arrays, the first activation nodes of the sense amplifiers in at least one of the memory-cell arrays being coupled to a plurality of drive circuits so that the plurality of drive circuits drive the first activation nodes of the sense amplifiers in at least one of the memory-cell arrays in parallel.

14. The dynamic random access memory of claim 13 wherein each memory cell comprises:
an access transistor having a gate terminal coupled to an associated word line, a drain terminal coupled to an associated digit line, and a source terminal; and
a capacitor having a first plate coupled to the source terminal, and a second plate coupled to receive a reference voltage.

15. A computer system, comprising:
a data input device;
a data output device; and
computing circuitry coupled to the data input and output devices, the computing circuitry including a memory device that includes,
an address decoder,
a read/write circuit,
a control circuit,
a plurality of memory-cell arrays formed in rows and columns on a semiconductor substrate, each memory-cell array including a plurality of memory cells arranged in rows and columns and coupled to one of a pair of complementary digit lines associated with each column,
a plurality of sense amplifier banks formed in rows and columns on the semiconductor substrate in regions between adjacent memory-cell arrays in each row of memory-cell arrays, each bank including a plurality of sense amplifiers including complementary data nodes and first and second activation nodes, and each bank being activated in response to respective activation signals on the first and second activation nodes,
a plurality of isolation circuits formed in the regions between adjacent memory-cell arrays, first and second isolation circuits being formed in each region, the first isolation circuit coupled between the complementary data nodes of the adjacent bank of sense amplifiers and the digit lines of one of the adjacent memory-cell arrays and the second isolation circuit coupled between the complementary data nodes of the adjacent bank of sense amplifiers and the digit lines of the other of the adjacent memory-cell array, each of the first and second isolation circuits isolating the data nodes from the digit lines of the associated memory-cell array in response to associated isolation signals, and
a plurality of drive circuits formed in respective gap-cell regions on the semiconductor substrate defined between adjacent rows of sense amplifier banks, each drive circuit having first and second output terminals coupled to the first and second activation nodes of the sense amplifiers in one of the adjacent sense amplifier banks, respectively, the first output terminal of each of the drive circuits being coupled to the first output terminal of at least one other drive circuit.

16. A method for sensing data stored in a memory device including a plurality of memory-cell arrays, each memory-cell array including a plurality of memory cells arranged in rows and columns and coupled to one of a pair of complementary digit lines associated with each column, a plurality of equilibration circuits each coupled between a pair of complementary digit lines and operable to equilibrate the voltage on the digit lines to a bias voltage in response to an associated equilibration signal, a plurality of sense amplifiers each including a pair of complementary data nodes and first and second activation nodes, and a plurality of isolation circuits each coupled between the complementary data nodes of a sense amplifier and an associated pair of complementary digit lines and operable to isolate the data nodes from the associated digit lines in response to an associated isolation signal, the method comprising the steps of:
activating all equilibration signals;
decoding at least a portion of a memory address corresponding to an addressed memory cell;
activating the isolation signals associated with all memory-cell arrays not containing the addressed memory cell;
deactivating the equilibration signals associated with the memory-cell array containing the addressed memory cell;
activating the row of memory cells containing the addressed memory cell; and
coupling the first activation node of the sense amplifiers associated with the memory-cell array containing the addressed memory cell to a first voltage source through a plurality of first parallel connected impedances.

17. The method of claim 16, further including the steps of:
coupling the second activation node of the sense amplifiers associated with the memory-cell array containing the addressed memory cell to a second voltage source through a plurality of second parallel connected impedances; and
sensing and storing the data stored in the row containing the addressed memory cell.

18. The method of claim 16 wherein the step of coupling the first activation node occurs before a step of coupling the second activation node of the sense amplifiers associated with the memory-cell array containing the addressed memory cell to a second voltage source through a plurality of second parallel connected impedances.

19. The method of claim 16 wherein the first voltage source is approximately equal to zero volts.

20. The method of claim 16 wherein the second voltage source is approximately equal to a supply voltage $V_{CC}$.

21. A method for sensing data stored in a memory device including a plurality of memory-cell arrays, each memory-cell array including a plurality of memory cells arranged in rows and columns and coupled to one of a pair of complementary digit lines associated with each column, a plurality of sense amplifiers, each sense amplifier including a pair of first and second activation nodes and a pair of complementary data nodes, the complementary data nodes coupled to a respective pair of complementary digit lines, the method comprising the steps of:

activating an addressed memory cell in one of the memory-cell arrays; and coupling the first activation node of the sense amplifiers associated with the memory-cell array containing the addressed memory cell to a first voltage source through a plurality of first parallel connected impedances.

22. The method of claim 21, further including the steps of:

coupling the second activation node of the sense amplifiers associated with the memory-cell array containing the addressed memory cell to a second voltage source through a plurality of second parallel connected impedances; and sensing and storing the data stored in the addressed memory cell.

23. The method of claim 21, further including the step of coupling the second activation node of the sense amplifiers associated with the memory-cell array containing the addressed memory cell to a second voltage source through a plurality of second parallel connected impedances, second activation node being coupled to the second voltage source after the step of coupling the first activation node.

24. The method of claim 21 wherein the first voltage source is approximately equal to zero volts.

25. The method of claim 21 wherein the second voltage source is approximately equal to a supply voltage $V_{CC}$.

26. A sense amplifier driver for activating a plurality of sense amplifiers coupled to respective digit lines in each of a plurality of memory-cell arrays, each of the sense amplifiers having first and second activation nodes, the sense amplifier driver comprising a plurality of drive circuits, each of the drive circuits including a respective enable circuit coupled to the first and second activation nodes of the sense amplifiers in at least one of the memory-cell arrays, the first activation nodes of the sense amplifiers in at least one of the memory-cell arrays being coupled to a plurality of respective drive circuits so that each of the plurality of drive circuits having its enable circuit activated drives the first activation nodes of the sense amplifiers in at least one of the memory-cell arrays in parallel.

27. The circuit of claim 26 wherein a respective sense amplifier drive circuit is provided for each of the plurality of memory-cell arrays.

28. The circuit of claim 26, further including the second activation nodes of the sense amplifiers in at least one of the memory-cell arrays being coupled to a plurality of drive circuits so that the plurality of drive circuits having their respective enable circuits activated drive the second activation nodes of the sense amplifiers in at least one of the memory-cell arrays in parallel.

29. The circuit of claim 26 wherein the plurality of sense amplifier drive circuits are formed in respective gap-cell regions of a semiconductor substrate.

30. The circuit of claim 26 wherein each of the sense amplifier drive circuits comprises:

a first drive transistor having a signal terminal coupled to a first voltage source, a second signal terminal, and a control terminal coupled to receive a first drive signal;

a second drive transistor having a signal terminal coupled to a second voltage source, a second signal terminal, and a control terminal coupled to receive a second drive signal;

a first enable transistor having signal terminals coupled between the second signal terminal of the first drive transistor and the first activation nodes of at least some of the plurality of sense amplifiers, and having its gate coupled to receive a first enable signal; and a second enable transistor having signal terminals coupled between the second signal terminal of the second drive transistor and the second activation nodes of at least some of the plurality of sense amplifiers, and having its gate coupled to receive a second enable signal.

31. The circuit of claim 30 wherein the first drive and enable transistors are NMOS transistors, and the second drive and enable transistors are PMOS transistors.

* * * * *

UNITED STATES PATENT AND TRADEMARK OFFICE
CERTIFICATE OF CORRECTION

PATENT NO. : 5,973,975
DATED : October 26, 1999
INVENTOR(S) : Raad

It is certified that error appears in the above-identified patent and that said Letters Patent is hereby corrected as shown below:

Column 6, line 61      "IS)2"      -- IS02 --

Signed and Sealed this

Twenty-second Day of May, 2001

Attest:

NICHOLAS P. GODICI

Attesting Officer      Acting Director of the United States Patent and Trademark Office